United States Patent [19]

Lazarus et al.

[11] Patent Number: 5,208,138

[45] Date of Patent: May 4, 1993

[54] HIGH CONTRAST HIGH THERMAL STABILITY POSITIVE PHOTORESISTS HAVING NOVOLAK RESINS OF LOWERED HYDROXYL CONTENT

[75] Inventors: Richard M. Lazarus, Mission Viejo; Randall Kautz, Irvine; Sunit S. Dixit, Mission Viejo, all of Calif.

[73] Assignee: Morton International, Inc., Chicago, Ill.

[21] Appl. No.: 886,976

[22] Filed: May 21, 1992

Related U.S. Application Data

[62] Division of Ser. No. 475,402, Feb. 5, 1990.

[51] Int. Cl.$^5$ .................... G03F 7/32; G03F 7/023
[52] U.S. Cl. .................... 430/326; 430/165; 430/192; 430/193
[58] Field of Search ............ 430/192, 193, 165, 326, 430/190

[56] References Cited

U.S. PATENT DOCUMENTS

| 4,308,368 | 12/1981 | Kubo et al. | 430/190 |
|---|---|---|---|
| 4,564,575 | 1/1986 | Perreault et al. | 430/165 |
| 4,681,923 | 7/1987 | Demmer et al. | 525/504 |
| 4,725,523 | 2/1988 | Miura et al. | 430/192 |
| 4,920,028 | 4/1990 | Lazarus et al. | 430/192 |
| 4,943,511 | 7/1990 | Lazarus et al. | 430/192 |
| 4,971,887 | 11/1990 | Schmitt et al. | 430/165 |
| 4,980,264 | 12/1990 | Chiong et al. | 430/192 |
| 4,983,492 | 1/1991 | Trefonas, III et al. | 430/191 |
| 4,996,122 | 2/1991 | Lazarus et al. | 430/17 |
| 4,997,734 | 3/1991 | Lazarus et al. | 430/17 |
| 5,019,479 | 5/1991 | Oka et al. | 430/192 |

*Primary Examiner*—Charles L. Bowers, Jr.
*Assistant Examiner*—John S. Chu
*Attorney, Agent, or Firm*—Robert M. Didrick; Gerald K. White; George W. Rauchfuss, Jr.

[57] ABSTRACT

Novolak resins are provided which are the condensation product of (a) a phenol, phenol derivative, or mixtures thereof, and (b) a mixture of formaldehyde or a formaldehyde precursor and (1) a monohydroxy aromatic aldehyde and wherein at least a portion of the hydroxyl groups thereof are esterified or (2) a mixture of at least one monohydroxy aromatic aldehyde and at least one non-hydroxylic aromatic aldehyde; the novolak resins having a hydroxyl number of from about 120 to about 180 grams of resin per equivalent of hydroxyl. The novolak resins are especially useful in positive photoresist formulations and have enhanced photospeed and film loss characteristics as well as improved thermal stability.

3 Claims, No Drawings

HIGH CONTRAST HIGH THERMAL STABILITY POSITIVE PHOTORESISTS HAVING NOVOLAK RESINS OF LOWERED HYDROXYL CONTENT

This is a divisional of copending application Ser. No. 07/475,402 filed on Feb. 5, 1990.

BACKGROUND OF THE INVENTION

1. Field of the Invention

The present invention relates generally to novolak resins, and, in particular, to novolak resins having lowered hydroxyl content and which are prepared using a mixture of aldehydes.

The present invention also relates generally to radiation-sensitive positive photoresist compositions and particularly to such compositions containing a novolak resin having lowered hydroxyl content and which are prepared from a mixture of aldehydes.

2. Description of the Prior Art

Positive photoresist formulations such as are described in, for example, U.S. Pat. Nos. 3,666,473; 4,115,128; 4,173,470; 4,377,631; 4,536,465; and 4,529,682, include alkali-soluble phenol-formaldehyde or cresol-formaldehyde resins together with light-sensitive materials, usually a substituted naphthoquinone diazide compound. The resins and sensitizers are dissolved in an organic solvent or mixture of solvents and are applied in a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation-induced structural transformation which decreases its efficiency as a dissolution rate inhibitor for the novolak and, subsequently, the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern of photoresist on the substrate.

Positive photoresists, especially those used to prepare microelectronic silicon wafers and chips, are often subjected to temperatures during the manufacture of the finished article which are high enough to have a deleterious effect on the photoresist. Thus, positive photoresists having improved thermal stability have long been sought. However, it is also very important that the photoresist be capable of providing high optical resolution so that precise patterns can be applied to the substrate. While positive photoresists having high resolution and contrast characteristics, such as DYNALITH ® EPR-5000 resist sold by the Dynachem Division of Morton International, are known, and positive photoresists having good thermal stability, such as DYNALITH ® OFPR-800 resist also sold by the Dynachem Division of Morton International, are also known, the art has yet to develop a positive photoresist which combines these thermal stability and high resolution and high contrast characteristics. In fact, formulation of a positive photoresist to enhance one of these characteristics normally adversely affects the other characteristic, i.e. photoresists with good thermal stability do not provide high resolution and high contrast and vice versa.

It was discovered and disclosed in earlier U.S. patent application Ser. No. 376,971, filed Jul. 6, 1989, U.S. Pat. No. 4,943,511, that positive photoresists having both a high degree of thermal stability and good resolution could be made when the novolak resin employed is prepared from a mixture of aldehydes comprising formaldehyde (or a formaldehyde precursor) and a monohydroxy aromatic aldehyde. However, while such positive photoresists had better thermal stability than the aforementioned DYNALITH ® EPR-5000 resist they generally were faster and lost more film in standard strength developers. Thus, it became desirable to develop positive photoresists that could maintain the improved thermal stability of the mixed aldehyde photoresists disclosed in said Ser. No. 376,971 while producing photoresists having still better photospeed and film loss characteristics. It was also desirable that positive photoresists be available that are "process tunable", i.e. positive photoresist compositions in which the photospeed characteristics of the photoresist composition can be made readily and easily adjustable and whereby the photoresists can be made to perform optionally in a wide variety of developers.

SUMMARY OF THE INVENTION

In accordance with the present invention, a new, improved class of novolak resin compositions of reduced hydroxyl content are provided, which novolak resins are based on the class of novolak resins disclosed in the aforementioned Ser. No 376,971. In accordance with the present invention a novel novolak resin and photoresist therefrom having improved contrast characteristics from reduced film loss and manageable photospeed properties is provided by a novolak resin comprising the condensation product of:

(A) a phenol, phenol derivative or mixtures thereof, and (B) a mixture of aldehydes comprising formaldehyde or a formaldehyde precursor and (1) a monohydroxy aromatic aldehyde and wherein said novolak resin has hydroxyl groups thereof esterified so that an aliphatic or aromatic ester group exists in place of the hydrogen atom in at least a portion of the hydroxyl groups, or (2) a mixture of at least one monohydroxy aromatic aldehyde and at least one non-hydroxylic aromatic aldehyde, said novolak resin having a hydroxyl number of about 120 to about 180 grams of resin per equivalent of hydroxyl.

Further provided in accordance with this invention is a positive photoresist composition comprising: a bindingly effective amount of the aforesaid novel novolak resins of lower hydroxyl content and a photoimaging amount of photosensitizer.

The present invention also provides a method of forming a resist pattern on a substrate comprising:

I. coating said substrate with a layer of a positive photoresist composition;

II. exposing said layer patternwise to actinic radiation; and

III. removing the exposed portion of said layer with an aqueous alkaline developer for the exposed resist composition to uncover the areas of the substrate beneath the exposed portions;

said positive photoresist comprising, prior to exposure, the aforesaid novel novolak resin of reduced hydroxyl content.

In accordance with the present invention, there is also provided a substrate coated with a thermally stable and highly resolved, exposed resist pattern, said resist pattern being formed from a positive photoresist composition which, prior to exposure to actinic radiation, comprises an aforesaid positive photoresist composition of this invention.

A still further aspect of the present invention is a process for preparation of the novel novolak resins of this invention. In accordance with this invention the novolak resins can be prepared by several methods. According to one method a novolak resin composition of this invention can be prepared by producing an unesterified novolak resin according to the procedure described in the aforesaid Application Ser. No. 376,971, wherein the novolak resin is the condensation product of: (A) a phenol, phenol derivative or mixtures thereof and (B) a mixture of aldehydes comprising (1) formaldehyde or a formaldehyde precursor and (2) a monohydroxy aromatic aldehyde, and then this novolak resin is esterified with a suitable amount of a suitable esterifying agent to produce novolak resin of this invention having the desired lowered hydroxyl number. Alternatively, the first produced unesterified novolak resin can be "over esterified", i.e. esterified to a higher percent esterification than desired in the final novolak resin composition of this invention. Suitable amounts of such over-esterified and unesterified novolak resin can then be blended to produce a novolak resin composition having a desired hydroxyl number of from about 120 to about 180 grams of resin per equivalent of hydroxyl.

Another method of producing a novel novolak resin composition of this invention is to produce the novolak resin of lowered hydroxyl content without esterifying unesterified novolak resin or without blending of esterified and unesterified resin. Such other method employs both a monohydroxy aromatic aldehyde and a non-hydroxylic aromatic aldehyde in combination with formaldehyde or a formaldehyde precursor in the mixture of aldehydes condensed with a phenol, phenol derivative or mixtures thereof to directly produce novolak resins of reduced hydroxy level compared to those produced by employing only a monohydroxy aromatic aldehyde in admixture with formaldehyde or a formaldehyde precursor condensed with a phenol, phenol derivative or mixtures thereof.

DETAILED DESCRIPTION OF THE INVENTION

According to this invention novolak resins of the type disclosed in the aforesaid U.S. Ser. No. 376,971, U.S. Pat. No. 4,943,511 are modified to provide new novolak resins compositions having hydroxyl numbers of from about 120 to about 180 grams of resin per equivalent of hydroxyl. The new novolak resin compositions are provided by either esterifying a suitable unesterified novolak resin, or blending a mixture of suitable esterified and unesterified novolak resins or by employing at least one monohydroxy aromatic aldehyde and at least one non-hydroxylic aromatic aldehyde in the aldehyde mixture condensed with a phenol, phenol derivative or mixtures thereof. In any case, one produces a novolak resin composition having a hydroxyl number of from about 120 to 180 grams of resin per equivalent of hydroxyl.

The novolak resins of the present invention are prepared from (1) phenol or a phenol derivative or mixtures thereof, and (2) a mixture of aldehydes which contains formaldehyde or a formaldehyde precursor and a monohydroxy aromatic aldehyde. The phenol and phenol derivatives useful in preparing these novolak resins include, but are not limited to, phenol, m-cresol, p-cresol, o-cresol, and mixtures thereof. Other examples of phenol derivatives may be found in H. Hiraoka, "Functionally Substituted Novolak Resins: Lithographic Applications, Radiation Chemistry, and Photooxidation", *Materials For Microlithography*, ACS Symposium Series No. 266 (1984) which is hereby incorporated herein by reference thereto. The phenol derivatives may also contain other substituents on the aromatic ring including, for example, alkyl or halogen moieties.

The mixed aldehydes useful in preparing the novolak resins of the present invention contain formaldehyde or a formaldehyde precursor. As used herein, "formaldehyde precursor" refers to compounds, such as 1,3,5-S-trioxane and paraformaldehyde which, under the reaction conditions employed to prepare the novolak resin will produce formaldehyde. As used herein, the term "formaldehyde" is understood to include both formaldehyde per se and formaldehyde precursors. The second component of the aldehyde mixture is any monohydroxy aromatic aldehyde or a mixture of at least one such monohydroxy aromatic aldehyde and at least one non-hydroxylic aromatic aldehyde which will form a novolak resin with phenol or a phenol derivative or mixtures thereof. In general, however, these aromatic aldehydes include, but are not limited to, compounds having the general formula:

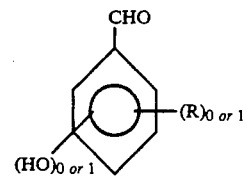

where R is alkyl (e.g. C1–C4 alkyl). Examples of preferred aromatic aldehydes include benzaldehyde, and monohydroxy aromatic aldehydes such as 2-hydroxybenzaldehyde, 3-hydroxybenzaldehyde, and 4-hydroxybenzaldehyde. The monohydroxy aldehydes are particularly preferred since they can be used to provide unesterified novolak resins which can be esterified and then a blend of the esterified and unesterified novolak resins from said monohydroxy aromatic aldehydes can be produced to provide the novel novolak resins of this invention and permit production of such novolak resins having a hydroxyl content within a wide range.

The relative amounts of the phenol or phenol derivative and mixed aldehydes used to prepare to novolak resins of the present invention may vary considerably. In general, these relative amounts are chosen to produce novolak resins having high melting points (Tg), high degree of substitution at the bridging carbons and relatively low molecular weights compared to novolak resins prepared from formaldehyde only. Typically, the following amounts of reactants are employed to produce the novolak resins of this invention:

$$\frac{\text{Moles total aldehyde}}{\text{Moles total phenol or pheno derivative}} \times 100 = \text{about 60\% to about 98\%}$$

$$\frac{\text{Moles aromatic aldehyde}}{\text{Moles total aldehyde}} \times 100 = \text{about 15\% to about 95\%}.$$

In a preferred embodiment, the phenol component is a mixture of phenol derivatives; namely, a mixture of m-cresol and p-cresol. When such a mixture is employed, it typically contains the following relative amounts of m- and p-cresol;

$$\frac{\text{Moles m-cresol}}{\text{Moles total cresol}} * \times 100 = \text{about 30\% to about 75\%}.$$

*It is not uncommon for commercially available cresols to contain minor amounts of o-cresol. Therefore, "Moles total cresol" refers to moles of m-, p-, and o-cresol (if any) and not just m- and p-cresol. It is preferred, however, that the o-cresol content be less than about 1% of the total cresol.

Given the above reactants and their relative amounts, one of ordinary skill in the art would be capable of preparing the novolak resins of the present invention without undue experimentation. Basically, all of the ingredients are placed in a suitable reaction vessel and a nonreactive solvent added. An acid catalyst, such as p-toluenesulfonic acid, is added in a mole ratio of moles catalyst/moles total cresol of about 0.01 to about 0.04. The reaction mixture is then raised to reflux temperature and reflux maintained until no more by-product water is produced, indicating that the reaction is complete.

Preferably, the novel novolak resins of this invention are prepared by blending (A) a novolak resin of a monohydroxy aromatic aldehyde esterified to a greater extent than needed or desired, with (B) an unesterified novolak resin of a monohydroxy aromatic aldehyde. In this manner, by proper selection of the extent of esterification of the esterified novolak resin and the ratio of esterified to unesterified novolak resin in the composition, one can readily produce novolak resin compositions of the invention with any suitable hydroxyl number and thus variable photoresist properties and characteristics. In this manner the novolak resin employed in the photolithography process becomes "tunable" in that certain process parameters become easily selectable merely by employing a novolak resin composition of this invention having the necessary hydroxyl number to produce the desired characteristics.

As an example of preferred novolak resin compositions of this invention there may be mentioned those having the aforementioned hydroxyl numbers of from about 120 to about 180 prepared by blending (A) an unesterified novolak prepared by condensation of a mixture of m-cresol and p-cresol with a mixture of aldehydes comprising formaldehyde or a formaldehyde precursor and o-, m- or p- hydroxybenzaldehyde with (B) an esterified novolak resin which is the novolak resin of component (A) esterified to about 32% esterification with acetic anhydride for example.

Esterification of the unesterified novolak resin produced by using monohydroxy aromatic aldehydes in the mixture of aldehydes can be accomplished by means of any suitable esterifying agent to replace hydrogen in at least a portion of the hydroxyl groups in the unesterified novolak with the group —OCR$^1$ wherein R$^1$ is an alkyl or aromatic radical, preferably alkyl of from 1 to 4 carbon atoms and aromatic is preferable aromatic of from 6 to 10 carbon atoms. As examples of such suitable esterification agents there may be mentioned, for example, acetic anhydride, p-tolyl chloride, dihydrocoumarin and the like. The novolak resin and esterifying agent will generally be reacted at reflux for about 10 to about 15 hours to produce the esterified novolak resin.

The novolak resins of lowered hydroxyl number of the present invention are especially useful in positive photoresist formulations. These formulations typically contain a novolak resin or mixture of esterified or unesterified novolak resins, a sensitizer or "photoactive component", solvent and various additives such as colorants, striation aids, and the like. In commercial positive photoresists, the novolak resin is most commonly a cresol-formaldehyde novolak and the photoactive component is a diazo quinone compound. Examples of diazo quinone compounds include 2,3,4-trihydroxybenzophenone-1, 2-napthoquinonediazide-5-sulfonic acid mono-, di-, and triesters and 2,3,4-trihydroxybenzophenone-1,2-naphthoquinone2-diazo-4-sulfonic acid mono-, di-, and triesters. Examples of these and other diazo sensitizers may be found in U.S. Pat. No. 4,499,171 issued Feb. 12, 1985 to Hosaka et al. Examples of solvents include, but are not limited to, propylene glycol monomethyl ether acetate (PMA), ethyl cellosolve acetate, ethyl 3-ethoxy propionate, diglyme, butyrolactone, xylene, and butyl acetate.

The critical components of the positive resist formulation, namely, the novolak resin of the present invention and the photoactive component, can be employed over a wide range of relative amounts. In general, it is necessary only that sufficient photoactive component be employed to produce a resist which is photoimageable and that the amount of novolak resin be bindingly effective. In terms of relative amounts, the positive photoresists of this invention may contain from about 2 parts by weight (pbw) novolak resin per pbw photoactive component to about 6 pbw novolak resin per pbw photoactive component. Preferably, a ratio of about 4 pbw novolak resin per pbw photoactive component is employed.

The amount of solvent in the resist may likewise vary considerably. Generally, all that is required is that sufficient solvent be employed to produce a desired coating thickness under the given coating conditions, e.g. spin speed and pre-bake temperature. Typically, however, enough solvent is added to the positive photoresist formulation to produce a photoresist having about 25–30% solids.

The positive resists of this invention may also contain various additives such as colorants, striation aids, and the like.

Positive resists formulated with the novolak resins of the present invention have the relatively high thermal stability like those in the aforesaid Application Ser. No. 376,971, i.e. are stable for at least 30 minutes in a convection oven at a temperature of about 200°–220° C., yet have greatly improved photospeed and film loss characteristics over the resists in said Application.

The products and processes of this invention and their advantages over the prior art are illustrated by the following examples and comparison tests in which temperatures are °C. and parts are parts by weight unless indicated otherwise.

A typical novolak resin of the type of Application Ser. No. 376,971 was prepared from the following reagents: 126 parts m-cresol, 103 parts p-cresol, 30 parts trioxane (aldehyde 1) and 124 parts O-hydroxybenzaldehyde (aldehyde 2) in 314 parts isopropyl acetate solvent and using 4 parts p-toluenesulfonic acid .$H_2O$ catalyst wherein the ratio of reactants was as follows:

| | |
|---|---|
| moles m-cresol/total moles cresol | = 0.55 |
| total moles aldehyde/total moles cresol | = 0.90 |
| moles aldehyde 1/total moles aldehyde | = 0.25 |
| moles aldehyde 2/total moles aldehyde | = 0.75 |
| moles catalyst/total moles cresol | = 0.010 |
| moles water/total moles cresol | = 0.01. |

All the ingredients, except the catalyst, were combined in a suitable reaction vessel. The catalyst was then added and the resulting reaction mixture was heated at reflux temperature. Reflux was continued until no more by-product water was produced, which indicated completion of the reaction. The resulting novolak resin was then recovered and upon analysis by SEC the resin was determined to have a weight average molecular weight of about 2600 and calculated to have a hydroxyl number of about 110 g/eq. This novolak resin is hereinafter referred to as resin X971. Three separate portions of novolak resin X971 were then acetylated by reaction at reflux for about 10 to 15 hours with appropriate amounts of acetic anhydride to produce acetylated X971 novolak resin with approximately 5, 20 and 32% acetylation, respectively. The three acetylated novolak resins are hereinafter referred to as X971-5Ac, X971-20Ac and X971-32Ac.

The synthesis of the 32% acetylated X971 novolak resin was conducted by combining 279 parts X971 resin, 122 parts acetic anhydride and 275 parts isopropyl acetate solvent in a suitable reaction vessel and heating the resulting reaction mixture to reflux temperature. The reflux temperature was maintained until the anhydride had completely reacted as judged by IR analysis. The other resins were similarly produced. These acetylated novolak resins were recovered and upon analysis were determined to have weight average molecular weights of 2400, 2500 and 2500, respectively, and calculated to have hydroxyl numbers of 119, 150 and 162 g/eq, respectively.

Two further novolak resins of modified hydroxyl number were prepared in the manner described hereinbefore for X971 resin. In these two resins a non-hydroxylic aromatic aldehyde (aldehyde 3) was substituted for a portion of the monohydroxy aromatic aldehyde (0-hydroxybenzaldehyde) in the aldehyde mixture of reactants. In the first such modified novolak resin benzaldehyde and in the second such modified resin anisaldehyde replaced a portion of the 0-hydroxybenzaldehyde reactant in the mixture of aldehydes employed in the reaction. In the production of both of these modified novolak resins the following ratios were maintained, as in the production of X971 resin, namely:

| | |
|---|---|
| moles m-cresol/total moles cresol | = 0.55 |
| total moles aldehyde/total moles cresol | = 0.90 |
| moles aldehyde 1/total moles aldehyde | = 0.25 |
| moles catalyst/total moles cresol | = 0.010 |
| moles water/total moles cresol | = 0.01. |

However, t he moles aldehyde 2/total moles aldehyde for these two reactions was 0.38 and the moles aldehyde 3/total moles aldehyde was 0.37 for each reaction. After completion of the reaction the resulting novolak resins were recovered. Analysis by SEC of the resin produced employing benzaldehyde, hereinafter referred to as X971-20 Bz, determined its weight average molecular weight to be about 1400 and its hydroxyl number was calculated to be 137 g/eq. Similarly, analysis by SEC of the resin produced employing anisaldehyde, hereinafter referred to as X971-20An, determined its weight average molecular weight to be about 1420 and its hydroxyl number was calculated to be 144 g/eq.

For comparison purposes DYNALITH ® EPR 5000 positive photoresist sold by the Dynachem Division of Morton International and the X971 novolak resin of the aforementioned Application Ser. No. 376,971 were employed as controls in the following photoresist evaluation tests. The reduced hydroxyl number novolak resins of this invention are either those prepared and described hereinbefore or are prepared by blending the esterified and unesterified X971 resins together in the amounts indicated in the following examples.

Each of the resist formulations comprise the indicated novolak resin or resins, about 25 to 30% by weight based on the weight of solids of photoactive compound and about 2% by weight or less of other standard components.

Each, in turn, of the resist compositions of the examples and comparative examples was spin coated on a track coater manufactured by Silicon Valley Group, California, onto thermally-grown silicon/silicon dioxide coated wafers of 4 inch diameter and 5000 Angstrom oxide thickness. A uniform coating of 1.0 $\mu$m of resist film was obtained at a spinning velocity of 3,500 revolutions per minute. The coated wafers were then soft baked either in an air circulating oven at 120.C for 30 minutes or on a track with hot plate at 110 C for 60 seconds. The resist film thickness was then measured with a Nanospec AFT thickness measuring tool.

The coated wafers were exposed with an Ultratech ® ultrastep 1000 (1:1) projection stepper fitted with a lens of N.A. 0.315 to provide ultraviolet exposure radiation in the range of 390 nm-450 nm. A Micromask ® mask with line and space widths of varying sizes, including some as small as 0.75 $\mu$m; was used to provide a selective exposure pattern. Exposure times were varied in order to determine the photospeed of the resist, i.e., the minimum amount of exposure energy (intensity x time) in millijoules/$cm^2$ which will solubilize the exposed areas of the resist so that the resist in the exposed areas will be completely removed/cleared during development.

The exposed resist coated wafers produced as described above were processed by one of two methods. In one method, the wafers were placed in Teflon wafer boats and processed in either EPD 80 or EPD 85 developer on SVG Model 8186 track developing equipment manufactured by Silicon Valley Group, California, at 19±1° C. In another method, the wafers were allowed to remain immersed in Dynachem's EPD-I developer solution for 60 seconds. Upon removal from the developer, the wafers were rinsed in deionized water and dried by a burst of nitrogen gas or by placing them in a spin dryer. Following development, the wafers were examined with an optical microscope at a "1000×" magnification.

Post-baking of the developed wafers was done in an air circulating convection oven at about 150°-180° C. or by a hot plate bake on a track at 160° C./60 seconds to increase the adhesion and chemical resistance of the undissolved portions of the coatings. Post-bake flow of the images were examined by an optical microscope at "1000×" magnification. The photoresists were tested for percent film loss (FL), photospeed mJ/cm² for gross clearing speed (GCS) and/or 1 micron clearing speed (1μCS) and for post development (PD) contrast and resolution by determining the largest spaces (in microns) not bridged.

Results of the performance tests are described below.

As indicated previously, the positive photoresist of Application Ser. No. 376,971 had better thermal stability than the commercially available EPR 5000 resist but was faster and lost more film in standard strength developers. The following test illustrate how the resists of the present invention retain the enhanced thermal stability of the resins of Application No. 376,971 while improving the photospeed and film loss characteristics thereof to match those of EPR 5000. Thus, positive photoresist of this invention are demonstrated to have better thermal stability than EPR 5000 while retaining photospeed and film loss characteristics substantially equivalent to those of EPP 5000.

PERFORMANCE RESULTS

| Comp. No. | Photoresist resin | Resin Ratio (pph) | Dev. Time (sec) | % FL | Photospeed GCS (mJ/cm²) |
|---|---|---|---|---|---|
| Control 1 | EPR 5000 | 100 | 42 | <1 | 125 |
| Control 2 | X971 | 100 | 22 | 100.0 | <20 |
| 1 | X971 | 67 | 42 | 100.0 | <20 |
|   | X971-20Ac | 33 | | | |
| 2 | X971 | 33 | 42 | 11.0 | 50 |
|   | X971-20Ac | 67 | | | |
| 3 | X971-20Ac | 100 | 22 | <1 | >260 |

Reducing the hydroxyl content of the X971 resin by 20% (Comp. 3) increased the photospeed from <20 to >260 mJ/cm², while the film loss fell from 100 to <1%. Similarly, reducing the hydroxyl content of the X971 resin by 14% (Comp. 2) increased the photospeed from <20 to 50 and decreased the film loss form 100 to 11%. However, reducing the hydroxyl content of the X971 resin by only 7% (Comp. 1) produced no change in photospeed and film loss characteristics compared to X971 resin. Thus, a reduction in the hydroxyl content of X971 type resins by at least 14 to 20% is necessary to achieve the improved novolak resins of this invention.

The above results demonstrate that the hydroxyl reduction can be achieved by blending esterified X971 type resin to the appropriate esterification level or by blending esterified and unesterified X971 type resin to achieve the desired level of hydroxyl number reduction.

Similar tests were conducted with a control resist (EPR 5000) and with mixed aldehyde novolak resins having reduced hydroxyl content wherein the reduced hydroxyl content was obtained by blending a X971 mixed aldehyde novolak with a mixed aldehyde resin having a non-hydroxylic aromatic aldehyde, benzaldehyde, substituted for a portion of the O-hydroxybenzaldehyde in the resin synthesis. The resulting resin is hereinafter referred to as resin X971-20Bz. Test results were as follows:

| Comp No. | Resin | Resin Ratio (pph) | Dev. Time (sec) | % FL | Photospeed (mJ/cm²) GCS | 1 μCS | Contrast & Resolution Gamma* | PD Temp (°C.) | Bridges (μ) |
|---|---|---|---|---|---|---|---|---|---|
| Control | EPR 5000 | 100 | 22 | <1 | 95 | 125 | 3.4 | 150 | 0.8 |
| 4 | X971 | 60 | 22 | 43.0 | <20 | | | | |
|   | X971-20Bz | 40 | | | | | | | |
| 5 | X971 | 45 | 22 | 4.7 | 45 | | | | |
|   | X971-20Bz | 55 | | | | | | | |
| 6 | X971 | 30 | 34 | 1.6 | 90 | 125 | 3.2 | 180 | 1.0 |
|   | X971-20Bz | 70 | | | | | | | |

*sidewall measurement: <2 not good, 2-3 good, >3 better.

Compositions 4, 5 and 6 are mixed aldehyde novolak resins having hydroxyl contents reduced by 8, 11 and 14%, respectively, from the hydroxyl content of the mixed aldehyde novolak resin (X971) of Application Serial Number 376,971. The above data demonstrates that reduction of the hydroxyl content by 14% (Comp. 6) by employing a non-hydroxylic aromatic aldehyde for a portion of the monohydroxy aromatic aldehyde in the synthesis of the mixed aldehyde novolak produces a resist matching the film loss and photospeed characteristics of an EPR 5000 resist and still having improved thermal stability.

Similar series of tests were conducted with photoresist of reduced hydroxyl content wherein the reduction of hydroxyl content was obtained by blending unesterified mixed aldehyde resin (X971) with appropriate amount of an over-esterified mixed aldehyde novolak resin X971-32Ac to demonstrate the tunable nature of the process of this invention and that such process can produce mixed aldehyde resists of the desired hydroxyl content to provide resists matching EPR 5000 resist in film loss and photospeed characteristics while obtaining the advantage of the enhance thermal stability of the mixed aldehyde novolak resins of Application Ser. No. 376,971. Also included in the tests was the aforementioned novolak resin X971-20An, an X971 type novolak resin having its hydroxyl content reduced 20% by substituting anisaldehyde for a portion of the O-hydroxybenzaldehyde in the aldehyde mixture employed in producing the X971 resin. The formulations and test results are as follows:

| Composition | Resin | Resin Ratio (pph) | Dev. Time (sec) | % FL | Photospeed (mJ/cm²) GCS | 1 μCS | Contrast & Resolution Gamma* | PD Temp (°C.) | Bridges (μ) |
|---|---|---|---|---|---|---|---|---|---|
| Control | EPR 5000 | 100 | 22 | <1 | 95 | 125 | 3.4 | 150 | 0.8 |
| 7 | X971 | 50 | 22 | 2.5 | 75 | | | | |
|   | X971-32Ac | 50 | | | | | | | |
| 8 | X971 | 40 | 32 | 1.4 | 90 | 125 | 2.9 | 180 | 0.8 |
|   | X971-32Ac | 60 | | | | | | | |

-continued

| Composition | Resin | Resin Ratio (pph) | Dev. Time (sec) | % FL | Photospeed (mJ/cm$^2$) GCS | 1 μCS | Contrast & Resolution Gamma* | PD Temp (°C.) | Bridges (μ) |
|---|---|---|---|---|---|---|---|---|---|
| 9 | X971 | 30 | 22 | <1 | 225 | | | | |
|   | X971-32Ac | 70 | | | | | | | |
| 10 | X971 | 20 | 22 | <1 | >260 | | | | |
|   | X971-32Ac | 80 | | | | | | | |
| 11 | X971-20An | 100 | 22 | 3.4 | 110 | 210 | | 160 | 1.0 |

*sidewall measurement: <2 not good, 2-3 good, >3 better.

Compositions 7, 8, 9, 10 and 11 are mixed aldehyde novolak resins having hydroxyl contents reduced 16, 19, 22, 26 and 20%, respectively, from the hydroxyl content of the mixed aldehyde novolak resin (X971) of Application Ser. No. 376,971. The above data demonstrates that a hydroxyl reduction of at least 16% or more, particularly 19%, produces mixed aldehyde novolak resins matching the film loss and photospeed characteristics of EPR 5000 novolak resin while retaining the enhance thermal stability of the mixed aldehyde novolak resins of Application Ser. No. 376,971.

The above results are rendered even more surprising and unexpected by the fact that resists having enhanced thermal stability as well as photospeed and film loss characteristics equivalent to EPR 5000 novolak resins are not obtained when:

(1) mixed aldehyde novolak resins are prepared by the previously described X971 resin synthesis process but the monohydroxy aromatic aldehyde reactant in the mixture of aldehydes is completely replaced with a non-hydroxylic aromatic aldehyde such as anisaldehyde, benzaldehyde, t-cinnamaldehyde, 1,4-terphthaldicarboxaldehyde—resists from such novolak resins were exceedingly slow and lost no film, and (2) esterification of conventional m-cresol/p-cresol novolak resins produced from formaldehyde or a formaldehyde precursor (without mixed aldehyde reactants, i.e. no monohydroxy aromatic aldehyde reactant)—such esterified conventional resins have poor thermal stability producing bridges at 1.5 and 2.0

The fact that esterification of such a conventional novolak resin does not produce the results obtained according to this invention is demonstrated when such a conventional m-cresol/p-cresol novolak resin, hereinafter referred to as resin X, having a hydroxyl number of 119 g/eq, is esterified with acetic anhydride at 5 and 15% esterification levels, or with p-toluene sulfonyl chloride at 5 and 15% esterification levels or with phthalide at 15% esterification level. The conventional novolak resin, i.e. resin X, was produced from reactants reacted at 95°–115° C. for about 58 hours and wherein:

| | |
|---|---|
| moles of m-cresol/total moles cresol | = 0.35 |
| moles formaldehyde/total moles cresol | = 0.64 |
| mole catalyst/total moles cresol | = 0.66 |
| mole water/total moles cresol | = 1.81 |

Esterification of such resin was in the same manner as previously described. Photoresist formulated, exposed and developed similar to the procedure previously described, but employing 2.40% tetramethylammonium hydroxide developer (2.4% NMD-3 developer sold by the Dynachem Division of Morton International) produced the following results:

| Resin | Dev. Time (sec) | FL % | Photospeed (mJ/cm$^2$) GCS | Bridges (μ) |
|---|---|---|---|---|
| X-5Ac | 60 | .73 | 75 | 1.50 |
| X-15Ac | 60 | .52 | 230 | 2.00 |
| X-5p-ToCl | 60 | 1.05 | >600 | — |
| X-15p-ToCl | 60 | 0.00 | >1200 | — |
| X-15Phth | 60 | 0.00 | 121 | 1.25 |

An example of a preferred positive photoresist composition of this invention comprises a resist formulation of:

| Component | Weight % |
|---|---|
| X971 resin | 29.9 |
| X971-32Ac resin | 18.9 |
| Solvent - PMA | 42.0 |
| Photoactive compound | 6.8 |
| Other components | 2.4 |

What is claimed is:

1. A method of forming a resist pattern on a substrate comprising:
   I. coating said substrate with a layer of a positive photoresist composition comprising an admixture of a bindingly effective amount of an esterified novolak resin and a photoimaging amount of a photosensitizer;
   II. exposing said layer patternwise to actinic radiation; and
   III. removing the exposed portion of said layer with an aqueous alkaline developer for the exposed resist compositon to uncover the areas of the substrate beneath the exposed portions;

said an esterified novalak resin comprising, prior to exposure:
   (a) a mixture of m- and p-cresol and
   (b) a mixture of aldehydes comprising formaldehyde or formaldehyde precursor and
   a monohydroxy aromatic aldehyde selected from the group consisting of 2-hydroxybenzaldehyde, 3-hydroxybenzaldehyde and 4-hydroxybenzaldehyde, wherein said an esterified novalak resin has hydroxyl groups thereof esterified so that an aliphatic or aromatic ester group exists in place of the hydrogen atom in at least a portion of the hydroxyl groups,
whereby said an esterified novolak resin having a hydroxyl number of about 120 to about 180 grams of resins per equivalent of hydroxyl.

2. The method of claim 1 wherein the phenol and aldehyde components of the novolak resin are present in the following amounts:

$$\frac{\text{moles total aldehyde}}{\text{moles total phenol or phenol derivative}} \times 100 = \text{about 60\% to about 98\%}$$

$$\frac{\text{moles monohydroxy aromatic aldehyde}}{\text{moles total aldehyde}} \times 100 = \text{about 15\% to about 95\%}.$$

3. The method of claim 1 wherein the m- and p-cresol are present in the following amounts:

$$\frac{\text{moles m-cresol}}{\text{moles total cresol}} \times 100 = \text{about 30\% to about 75\%}.$$

* * * * *